United States Patent
Chou et al.

(10) Patent No.: US 10,636,875 B1
(45) Date of Patent: Apr. 28, 2020

(54) LOCALIZED TUNNELING ENHANCEMENT FOR SEMICONDUCTOR DEVICES

(71) Applicants: Yeong-Chang Chou, Irvine, CA (US); Hsu-Hwei Chen, Redondo Beach, CA (US); Hui Ma, Manhattan Beach, CA (US); Thomas R. Young, Manhattan Beach, CA (US); Youngmin Kim, Manhattan Beach, CA (US); Jansen J. Uyeda, Manhattan Beach, CA (US)

(72) Inventors: Yeong-Chang Chou, Irvine, CA (US); Hsu-Hwei Chen, Redondo Beach, CA (US); Hui Ma, Manhattan Beach, CA (US); Thomas R. Young, Manhattan Beach, CA (US); Youngmin Kim, Manhattan Beach, CA (US); Jansen J. Uyeda, Manhattan Beach, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/252,932

(22) Filed: Jan. 21, 2019

(51) Int. Cl.
| | |
|---|---|
| H01L 29/08 | (2006.01) |
| H01L 29/20 | (2006.01) |
| H01L 29/45 | (2006.01) |
| H01L 29/66 | (2006.01) |
| H01L 29/778 | (2006.01) |
| H01L 21/38 | (2006.01) |
| H01L 21/40 | (2006.01) |
| H01L 21/24 | (2006.01) |
| H01L 29/207 | (2006.01) |

(52) U.S. Cl.
CPC ...... H01L 29/0895 (2013.01); H01L 29/0843 (2013.01); H01L 29/207 (2013.01); H01L 29/452 (2013.01); H01L 29/66462 (2013.01); H01L 29/7787 (2013.01); H01L 21/24 (2013.01); H01L 21/38 (2013.01); H01L 21/40 (2013.01)

(58) Field of Classification Search
CPC ............ H01L 29/0895; H01L 29/0843; H01L 29/207; H01L 29/452; H01L 29/66462; H01L 29/7787; H01L 21/38; H01L 21/388; H01L 21/40; H01L 21/244; H01L 21/246
See application file for complete search history.

(56) References Cited

U.S. PATENT DOCUMENTS

| | | | | |
|---|---|---|---|---|
| 8,987,781 | B2* | 3/2015 | Yuan | H01L 29/205 257/192 |
| 9,196,614 | B2* | 11/2015 | Kub | H01L 29/41725 |
| 10,079,266 | B2* | 9/2018 | Wiegand | H01L 27/222 |
| 10,109,729 | B2* | 10/2018 | Liu | H01L 29/7783 |
| 10,115,802 | B2* | 10/2018 | Sato | H01L 21/0254 |

(Continued)

*Primary Examiner* — Ida M Soward
(74) *Attorney, Agent, or Firm* — Tarolli, Sundheim, Covell and Tummino LLP

(57) ABSTRACT

A semiconductor device includes a plurality of base layers. A tunneling layer is disposed on the plurality of base layers. A contact layer is disposed on the tunneling layer. An alloyed metal contact is annealed on to the contact layer. The alloyed metal contact forms a first region and a second region in the contact layer. The first region of the contact layer diffuses into the tunneling layer. The second region of the contact layer resides over the tunneling layer. The tunneling layer facilitates electron mobility of the second region.

20 Claims, 18 Drawing Sheets

(56) References Cited

U.S. PATENT DOCUMENTS

| | | | |
|---|---|---|---|
| 2008/0258150 A1* | 10/2008 | McCarthy | H01L 21/26546 257/76 |
| 2015/0048418 A1* | 2/2015 | Lin | H01L 29/778 257/190 |
| 2018/0182879 A1* | 6/2018 | Ren | H01L 21/246 |
| 2018/0204928 A1* | 7/2018 | Nakata | H01L 29/7786 |

* cited by examiner

| | |
|---|---|
| DOPED TUNNELING LAYER | 810 |
| UNDOPED BARRIER LAYER | 760 |
| TOP SILICON DOPING LAYER | 750 |
| TOP SPACER LAYER | 744 |
| CHANNEL LAYER | 740 |
| BOTTOM SPACER LAYER | 734 |
| BOTTOM SILICON DOPING LAYER | 730 |
| BUFFER LAYER | 720 |
| SUBSTRATE LAYER | 710 |

FIG. 8

| | |
|---|---|
| CONTACT LAYER | 910 |
| DOPED TUNNELING LAYER | 810 |
| UNDOPED BARRIER LAYER | 760 |
| TOP SILICON DOPING LAYER | 750 |
| TOP SPACER LAYER | 744 |
| CHANNEL LAYER | 740 |
| BOTTOM SPACER LAYER | 734 |
| BOTTOM SILICON DOPING LAYER | 730 |
| BUFFER LAYER | 720 |
| SUBSTRATE LAYER | 710 |

LOCALIZED TUNNELING ENHANCEMENT FOR SEMICONDUCTOR DEVICES

TECHNICAL FIELD

This disclosure relates to semiconductor devices, and more specifically to localized tunneling enhancement for semiconductor devices.

BACKGROUND

A High-electron-mobility transistor (HEMT), also known as heterostructure FET (HFET) or modulation-doped FET (MODFET), is a field-effect transistor incorporating a junction between two materials with different band gaps forming a heterojunction as the channel instead of a doped region (as is generally the case for MOSFET). A commonly used material combination is GaAs with AlGaAs, though there is wide variation, dependent on the application of the device. Devices incorporating more Indium (In) generally provide better high-frequency performance, while in recent years, gallium nitride HEMTs have been employed due to their high-power performance. Like other FETs, HEMTs are used in integrated circuits as digital switching devices. These devices can also be used as amplifiers for large amounts of current using a small voltage as a control signal. Both of these uses are made possible by the device's unique current-voltage characteristics. For instance, HEMT transistors can operate at higher frequencies than ordinary transistors, up to millimeter wave frequencies, and are often used in high-frequency products such as cell phones, satellite television receivers, voltage converters, and radar equipment. They are also widely used in satellite receivers, in low power amplifiers, and in the defense industry.

SUMMARY

This disclosure relates to semiconductor devices, integrated circuits, and forming methods. In one aspect, a semiconductor device includes a plurality of base layers. A tunneling layer is disposed on the plurality of base layers. A contact layer is disposed on the tunneling layer. An alloyed metal contact is annealed on to the contact layer. The alloyed metal contact forms a first region and a second region in the contact layer. The first region of the contact layer diffuses into the tunneling layer. The second region of the contact layer resides over the tunneling layer. The tunneling layer facilitates electron mobility of the second region.

In another aspect, a method includes forming a plurality of base layers on a substrate. The method includes forming a tunneling layer on the plurality of base layers and forming a contact layer on the tunneling layer. The method includes annealing an alloyed drain or alloyed source contact on to the contact layer that forms a first region and a second region in the contact layer. The first region of the contact layer diffuses into the tunneling layer and the second region of the contact layer is diffused less than the first region into the tunneling layer. The tunneling layer facilitates electron transport within the second region.

In yet another aspect, an integrated circuit includes a substrate layer and a buffer layer disposed on the substrate layer. A bottom silicon doping layer is disposed on the buffer layer, a bottom spacer layer is disposed on the bottom silicon doping layer, a channel layer is disposed on the bottom spacer layer, a top spacer layer is disposed on the channel layer, and a top silicon doping layer is disposed on the top spacer layer. An undoped barrier layer is disposed on the top silicon doping layer. A doped tunneling layer is disposed on the undoped barrier layer and a contact layer is formed on the doped tunneling layer. A gate region is formed in the contact layer, the doped tunneling layer, and the undoped barrier layer. An alloyed metal source contact and an alloyed metal drain contact are annealed on to the contact layer. The alloyed metal source contact forms a first source region and a second source region in the contact layer and the alloyed metal drain contact forms a first drain region and a second drain region in the contact layer. The first source region and the first drain region of the contact layer diffuses into the doped tunneling layer. The second source region and the second drain region of the contact layer resides over the doped tunneling layer. The doped tunneling layer facilitates electron mobility of the second source region and the second drain region. A gate is formed in the gate region to control current from the alloyed metal drain contact to the alloyed metal source contact.

BRIEF DESCRIPTION OF THE DRAWINGS

FIGS. 7-13 illustrate a method for forming the semiconductor devices illustrated in FIGS. 1-5.

DETAILED DESCRIPTION

Figure 1:
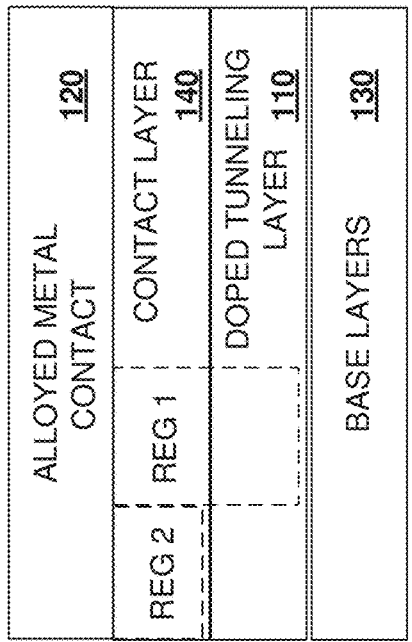
FIG. 1 illustrates an example of a semiconductor device that employs localized tunneling to facilitate electron mobility of a region in the semiconductor device.

This disclosure relates to localized tunneling enhancement for semiconductor devices. As used herein, the term localized tunneling refers to providing a tunneling layer to facilitate electron mobility within portions of the semiconductor device where diffusion from upper alloyed conductive layers of the device have not penetrated as far in one region of the device as another region. These regions are referred to as a first region in the semiconductor device where diffusion from the upper layers has occurred and a second region of the semiconductor device where the diffusion is less than that of the first region. The tunneling layer is provided to increase the performance of the second region of the semiconductor device by improving the tunneling probability of the second region and reducing the barrier height of the second region. By improving the performance of the second region with the tunneling layer, improvements in current carrying capability (IMAX), gain (GMP), on-resistance (RON), cut-off frequency (FT), and radio frequency (RF) performance of the semiconductor device is improved over devices that do not employ localized tunneling.

In one example, the semiconductor device includes a plurality of base layers. A tunneling layer is disposed on the plurality of base layers and a contact layer is disposed on the tunneling layer. An alloyed metal contact (e.g., Au/Ni/Ge/Au) is annealed on to the contact layer. The alloyed metal contact forms a first region and a second region in the contact layer. The first region of the contact layer diffuses into the tunneling layer, whereas the second region of the contact layer resides over the tunneling layer (e.g., not diffused to the depth of the first region). The tunneling layer facilitates electron transport and mobility of the second region by improving the tunneling probability of the second region and decreasing the barrier height of the second region.

The plurality of base layers can include a substrate layer and a buffer layer disposed on the substrate layer to improve uniformity of the substrate layer. A bottom silicon doping layer is disposed on the buffer layer and a bottom spacer layer is disposed on the bottom silicon doping layer. A channel layer to conduct current in the semiconductor device is disposed on the bottom spacer layer, and a top spacer layer is disposed on the channel layer, where a top silicon doping layer is disposed on the top spacer layer. An undoped barrier layer is disposed on the top silicon doping layer. A doped tunneling layer is disposed on the undoped barrier layer and a contact layer is formed on the doped tunneling layer. A gate region is formed in the contact layer, the doped tunneling layer, and the undoped barrier layer. The doped tunneling layer can be formed from similar materials as the barrier layer. The tunneling layer in contrast to the undoped barrier layer is doped with silicon to provide tunneling performance.

In a semiconductor device transistor, an alloyed metal source contact and an alloyed metal drain contact are annealed on to the contact layer. The alloyed metal source contact forms a first source region and a second source region in the contact layer and the alloyed metal drain contact forms a first drain region and a second drain region in the contact layer. The first source region and the first drain region of the contact layer diffuses into the doped tunneling layer. The second source region and the second drain region of the contact layer resides over the doped tunneling layer. The tunneling layer facilitates electron transport and mobility of the second source region and the second drain region. A gate is formed in the gate region to control current from the alloyed metal drain contact to the alloyed metal source contact. In one example, the semiconductor devices and integrated circuits described herein can be provided as high electron mobility transistors (HEMT).

FIG. 1 illustrates an example of a semiconductor device 100 that employs localized tunneling to facilitate electron transport and mobility of a region in the semiconductor device. As used herein, the term localized tunneling refers to providing a doped tunneling layer 110 to facilitate electron mobility within portions of the semiconductor device 100 where diffusion from upper alloyed conductive layers of the semiconductor device shown as alloyed metal contact 120 have not penetrated as far in one region of the semiconductor device as another region. These regions are referred to as a first region (REG 1) in the semiconductor device 100 where diffusion from the upper layers has occurred and a second region (REG 2) of the semiconductor device where the diffusion is less than that of the first region. The doped tunneling layer 110 is provided to increase the performance of the second region REG 2 of the semiconductor device 100 by improving the tunneling probability of the second region and reducing the barrier height of the second region. Such performance increases can include improvements in current carrying capability (IMAX), gain (GMP), on-resistance (RON), cut-off frequency (FT), and radio frequency (RF) performance of the semiconductor device 100 (e.g., over devices that do not employ localized tunneling for REG 2).

As shown, the semiconductor device 100 includes a plurality of base layers 130. The doped tunneling layer 110 is disposed on the plurality of base layers 130 and a contact layer 140 is disposed on the doped tunneling layer. The alloyed metal contact 120 (e.g., Au/Ni/Ge/Au) is annealed (e.g., heated at about 390 degrees C.) on to the contact layer 140 which causes the alloyed metal contact to diffuse into other layers of the semiconductor device 100. In this example, the alloyed metal contact 120 forms the first region REG 1 and a second region REG 2 in the contact layer 140. The first region REG 1 of the contact layer 140 diffuses into the doped tunneling layer 110 (or beyond), whereas the second region REG 2 of the contact layer resides over the doped tunneling layer (e.g., not diffused to the depth of the first region). As mentioned, the doped tunneling layer 110 facilitates electron mobility of the second region REG 2 by improving the tunneling probability of the second region and decreasing the barrier height of the second region.

The semiconductor device 100 can be configured as a diode, transistor, or within other portions of a semiconductor circuit. In one example configuration, the semiconductor device 100 is provided as part of a field effect transistor such as shown in the examples of FIGS. 2-6. Thus, in a transistor configuration, the alloyed metal contact 120 can be a drain or a source of the semiconductor device 100. The alloyed metal contact 120 can be, for example, formed from at least two of gold (Au), Nickle (Ni), and Germanium (Ge).

Figure 2:
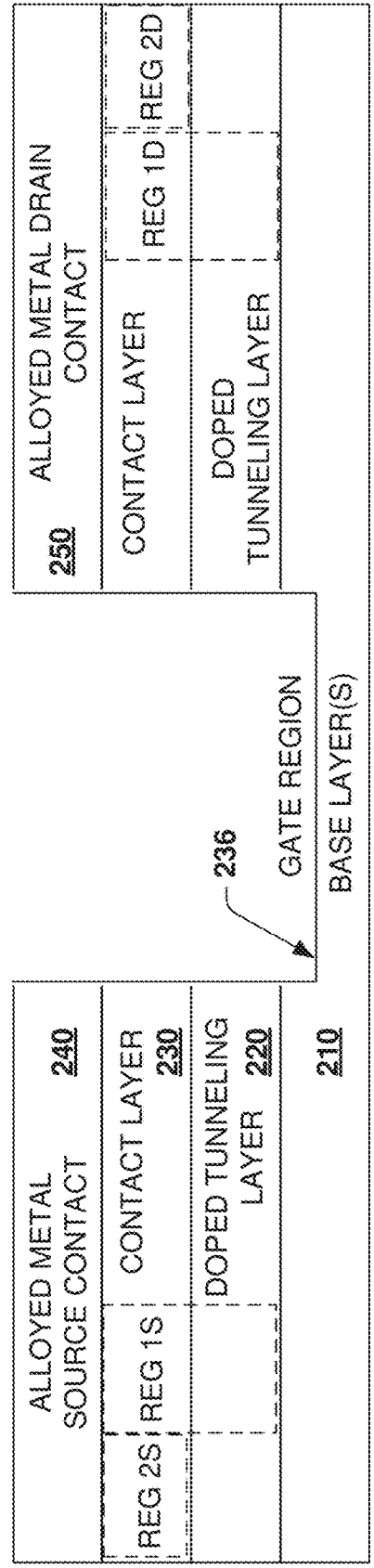
FIG. 2 illustrates an example of a semiconductor device transistor that employs localized tunneling to facilitate electron mobility in multiple regions in the semiconductor device transistor.

FIG. 2 illustrates an example of a semiconductor device transistor 200 that employs localized tunneling to facilitate electron transport and mobility in multiple regions in the semiconductor device transistor. The semiconductor device transistor 200 can be provided as part of an integrated circuit that includes a plurality of base layers 210. A doped tunneling layer 220 is disposed on the base layers 210 and a contact layer 230 is disposed on the doped tunneling layer. A gate region 236 is formed in the contact layer 230, the doped tunneling layer 220, and the base layers 210. An alloyed metal source contact 240 and an alloyed metal drain contact 250 are annealed on to the contact layer 230. The alloyed metal source contact 240 forms a first source region (REG 1S) and a second source region (REG 2S) in the contact layer 230 and the alloyed metal drain contact 250 forms a first drain region (REG 1D) and a second drain region (REG 2D) in the contact layer 230. The first source region REG 1S and the first drain region REG 1D of the contact layer 230 diffuses into the doped tunneling layer 220. The second source region REG 2S and the second drain region REG 2D of the contact layer 230 resides over the doped tunneling layer 230 (or does not diffuse as far into the tunneling layer as REG 1S and REG 1D). The doped tunneling layer 220 facilitates electron transport and mobility of the second source region REG 2S and the second drain region 2D. A gate (not shown) can be formed in the gate region 236 to control current from the alloyed metal drain contact 250 to the alloyed metal source contact 240.

Figure 3:
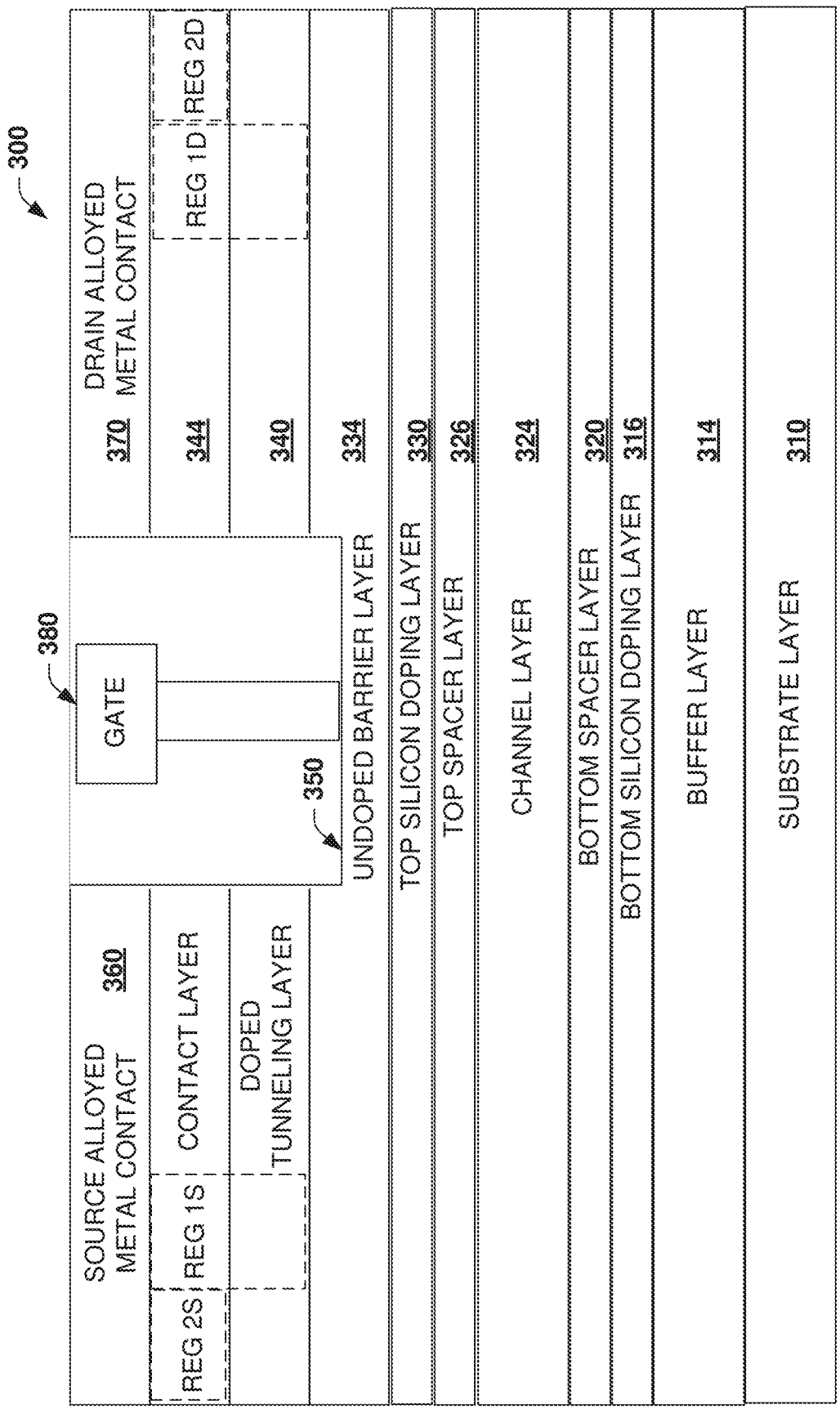
FIG. 3 illustrates an example of a semiconductor device transistor formed on multiple base layers that employs localized tunneling layer disposed on the base layers to facilitate electron mobility in multiple regions in the semiconductor device transistor.

FIG. 3 illustrates an example of a semiconductor device transistor 300 formed on multiple base layers that employs localized tunneling disposed on the base layers to facilitate electron transport and mobility in multiple regions in the semiconductor device transistor. The semiconductor device transistor 300 can be provided as an integrated circuit along with a plurality of other semiconductor devices (e.g., on a common substrate) that are not shown. The semiconductor device transistor 300 includes a substrate layer 310 and a buffer layer 314 disposed on the substrate layer to mitigate nonuniformity of the substrate layer. A silicon doping layer 316 is disposed on the buffer layer 314. A bottom spacer layer 320 is disposed on the bottom silicon doping layer 316, a channel layer 324 is disposed on the bottom spacer layer 320, a top spacer layer 326 is disposed on the channel layer 324, and a top silicon doping layer 330 is disposed on the top spacer layer 326. An undoped barrier layer 334 is disposed on the top silicon doping layer 330. A doped tunneling layer 340 is disposed on the undoped barrier layer 334 and a contact layer 344 is formed on the doped tunneling layer. The doped tunneling layer 340 can be formed out of similar materials as the undoped barrier layer 334. In a conventional device, the barrier layer may have been provided in a thickness of about 500 angstroms, where an angstrom is $10^{-10}$ meters. In this example, the undoped barrier layer 334 is about 425 angstroms in thickness and the doped tunneling layer 340 is about 75 angstroms in thickness. The difference between the undoped barrier layer 334 and doped tunneling layer 340 in addition to thickness is that the doped tunneling layer is also doped with a silicon impurity (n+). The doping of the tunneling layer 340 is about $6e^{18}$ carriers per $cm^3$. There are at least two temperatures for doped tunneling layer growth, the temperature of the Si source that is used to control the doping rate, and the temperature of the substrate during deposition. The Si source temperature vs doping rate can vary and a plot of doping concentration vs Si source temp can be generated to account for the variances, and updated since the Si source temperature can vary. However, the substrate temperature is substantially constant and controlled to about 615 degrees+/−5° Celcius.

A gate region 350 is formed in the contact layer 344, the doped tunneling layer 340, and the undoped barrier layer 334. An alloyed metal source contact 360 and an alloyed metal drain contact 370 are annealed on to the contact layer 344. The alloyed metal source contact 360 forms a first source region REG 1S and a second source region REG 2S in the contact layer 344 and the alloyed metal drain contact 370 forms a first drain region REG 1D and a second drain region 2D in the contact layer. The first source region REG 1S and the first drain region REG 1D of the contact layer 344 diffuses into the doped tunneling layer 340. The second source region REG 2D and the second drain region REG 2D of the contact layer 344 resides over the doped tunneling layer 340. A gate 380 (e.g., T-gate) is formed in the gate region 350 to control current from the alloyed metal drain contact 370 to the alloyed metal source contact 360. As will be illustrated in the examples of FIGS. 4-6, various materials can be employed to provide the layers and other portions of the semiconductor devices and integrated circuits described herein. For instance, the undoped barrier layer 334 is about 425 angstroms in thickness and the doped tunneling layer 340 is about 75 angstroms in thickness. In one example, undoped the barrier layer 334 is $Al_{(0.25)}Ga_{(0.75)}As$, with Al being Aluminum, Ga being Gallium, and As being Arsenic and the doped tunneling layer 340 is $Al_{(0.25)}Ga_{(0.75)}As$ that is doped with silicon (n+), and the contact layer 344 is n+GaAs. Other materials are possible as described below.

Figure 4:
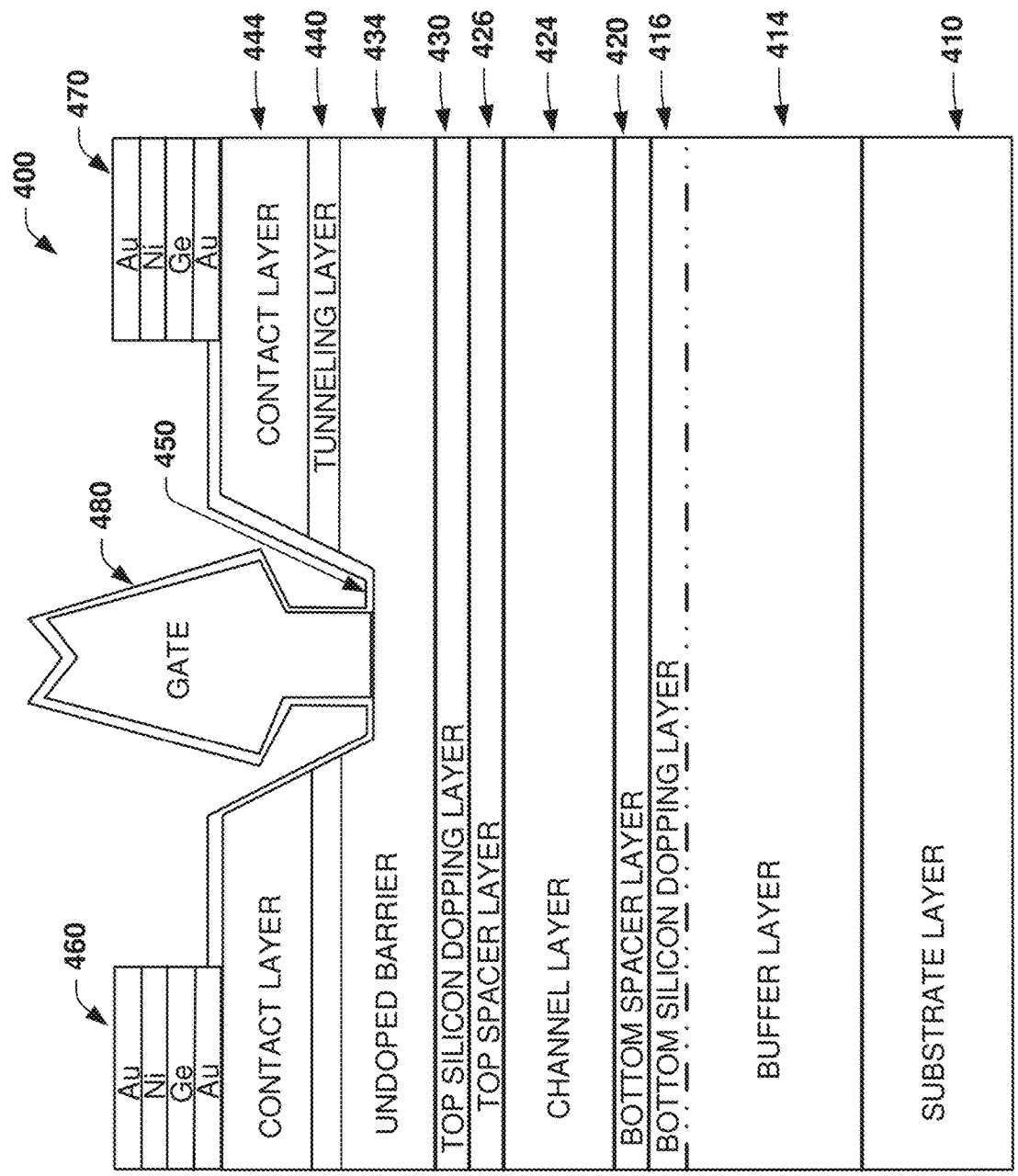
FIG. 4 illustrates an example of the semiconductor device transistor illustrated in FIG. 3.

FIG. 4 illustrates an example of the semiconductor device transistor illustrated in FIG. 3. A semiconductor device transistor 400 includes a substrate layer 410 and a buffer layer 414 disposed on the substrate layer. A bottom silicon doping layer 416 is disposed on the buffer layer 414. A bottom spacer layer 420 is disposed on the bottom silicon doping layer 416, a channel layer 424 is disposed on the bottom spacer layer 420, a top spacer layer 426 is disponed on the channel layer 424, and a top silicon doping layer 430 is disposed on the top spacer layer 426. An undoped barrier layer 434 is disposed on the top silicon doping layer 430. A doped tunneling layer 440 is disposed on the undoped barrier layer 434 and a contact layer 444 is formed on the doped tunneling layer 440. A gate region 450 is formed in the contact layer 444, the doped tunneling layer 440, and the undoped barrier layer 434. An alloyed metal source contact 460 and an alloyed metal drain contact 470 are annealed on to the contact layer 444.

A gate 480 is formed in the gate region 450 to control current from the alloyed metal drain contact 470 to the alloyed metal source contact 460. The alloyed metal contacts 460 and 470 can be composed of an alloy of metals that includes for example, a bottom gold (Au) layer, with a Germanium (Ge) layer disposed thereon, with a Nickel (Ni) layer disposed on the Ge layer, and a final Au layer disposed on the Ni layer to form the overall alloyed metal contact. In this example, the undoped barrier layer 434 is $Al_{(0.25)}Ga_{(0.75)}As$, with Al being Aluminum, Ga being Gallium, and As being Arsenic, the doped tunneling layer 440 is $Al_{(0.25)}Ga_{(0.75)}As$ that is doped with silicon (n+), and the contact layer 444 is n+GaAs. The substrate layer 410 is GaAs, the buffer layer 414 is $Al_{(0.25)}Ga_{(0.75)}As$, and the channel layer 424 is Indium (In)GaAs (e.g., $In_{(0.22)}Ga_{(0.78)}As$). The top and bottom spacer layers 420 and 426 respectively can be formed of $Al_{(0.25)}Ga_{(0.75)}As$.

Figure 5:
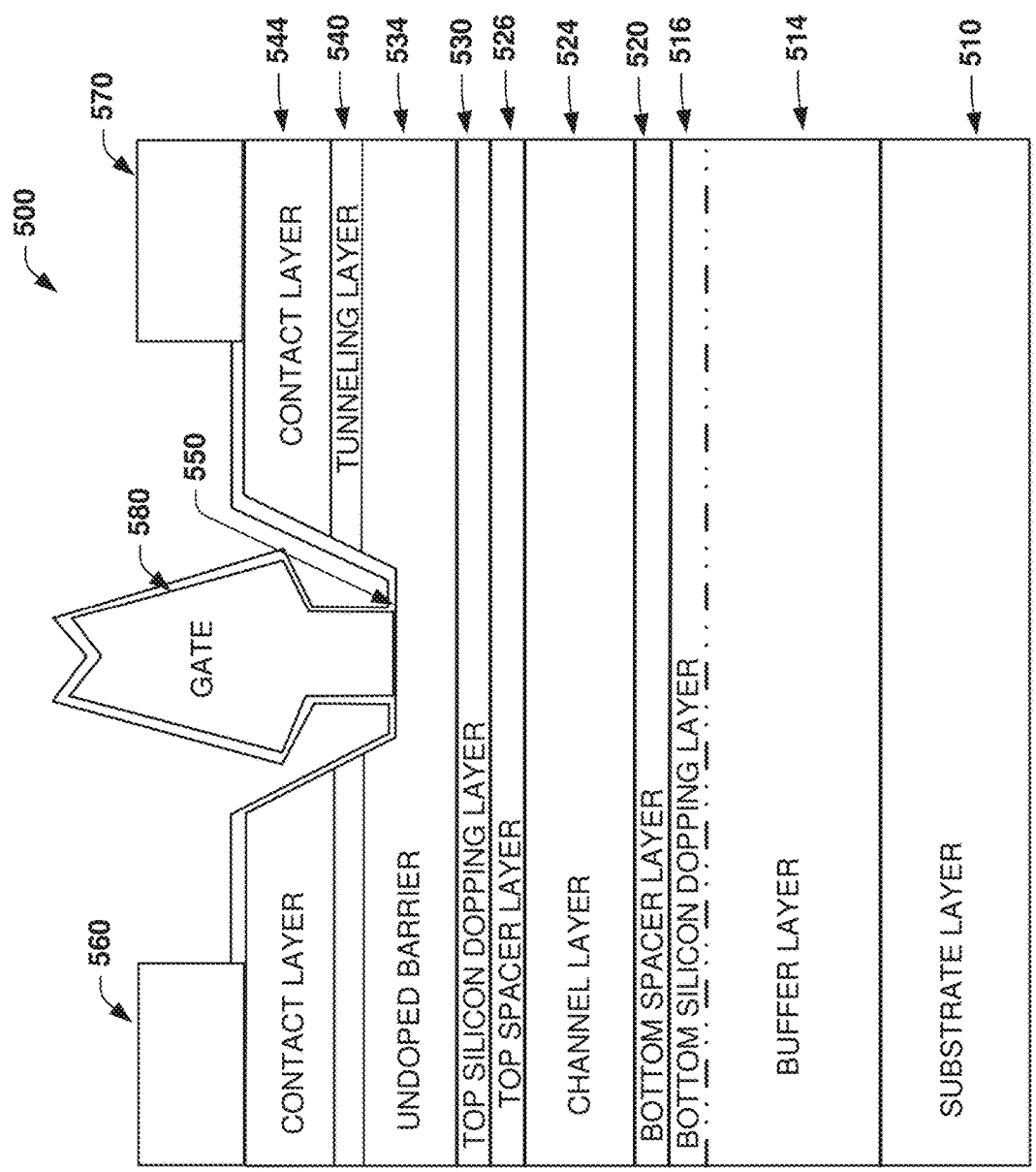
FIG. 5 illustrates another example of the semiconductor device transistor illustrated in FIG. 3.

FIG. 5 illustrates another example of the semiconductor device transistor illustrated in FIG. 3. A semiconductor device transistor 500 includes a substrate layer 510 and a buffer layer 514 disposed on the substrate layer. A bottom silicon doping layer 516 is disposed on the buffer layer 514, a bottom spacer layer 520 is disposed on the bottom silicon doping layer 516, a channel layer 524 is disposed on the bottom spacer layer 520, and a spacer layer 526 is disposed on the channel layer 524. An undoped barrier layer 534 is disposed on the top silicon doping layer 530. A doped tunneling layer 540 is disposed on the undoped barrier layer 534 and a contact layer 544 is formed on the doped tunneling layer 540.

A gate region 550 is formed in the contact layer 544, the doped tunneling layer 540, and the undoped barrier layer 534. An alloyed metal source contact 560 and an alloyed metal drain contact 570 are annealed on to the contact layer 544. A gate 580 is formed in the gate region 550 to control current from the alloyed metal drain contact 570 to the alloyed metal source contact 560. The alloyed metal contacts 560 and 570 can be composed of an alloy of metals as previously described with respect to FIG. 4. In this example, the barrier layer 534 is $In_{(0.50)}Ga_{(0.50)}$ P, with In being Indium, Ga being Gallium, and P being Phosphorus, the doped tunneling layer 540 is $In_{(0.50)}Ga_{(0.50)}$ P that is doped with silicon (n+), and the contact layer 544 is n+GaAs. The substrate layer 510 is GaAs, the buffer layer 514 is $Al_{(3.25)}Ga_{(0.75)}$ As, and the channel layer 524 is Indium (In)GaAs (e.g., $In_{(0.22)}Ga_{(0.78)}As$).

Figure 6:
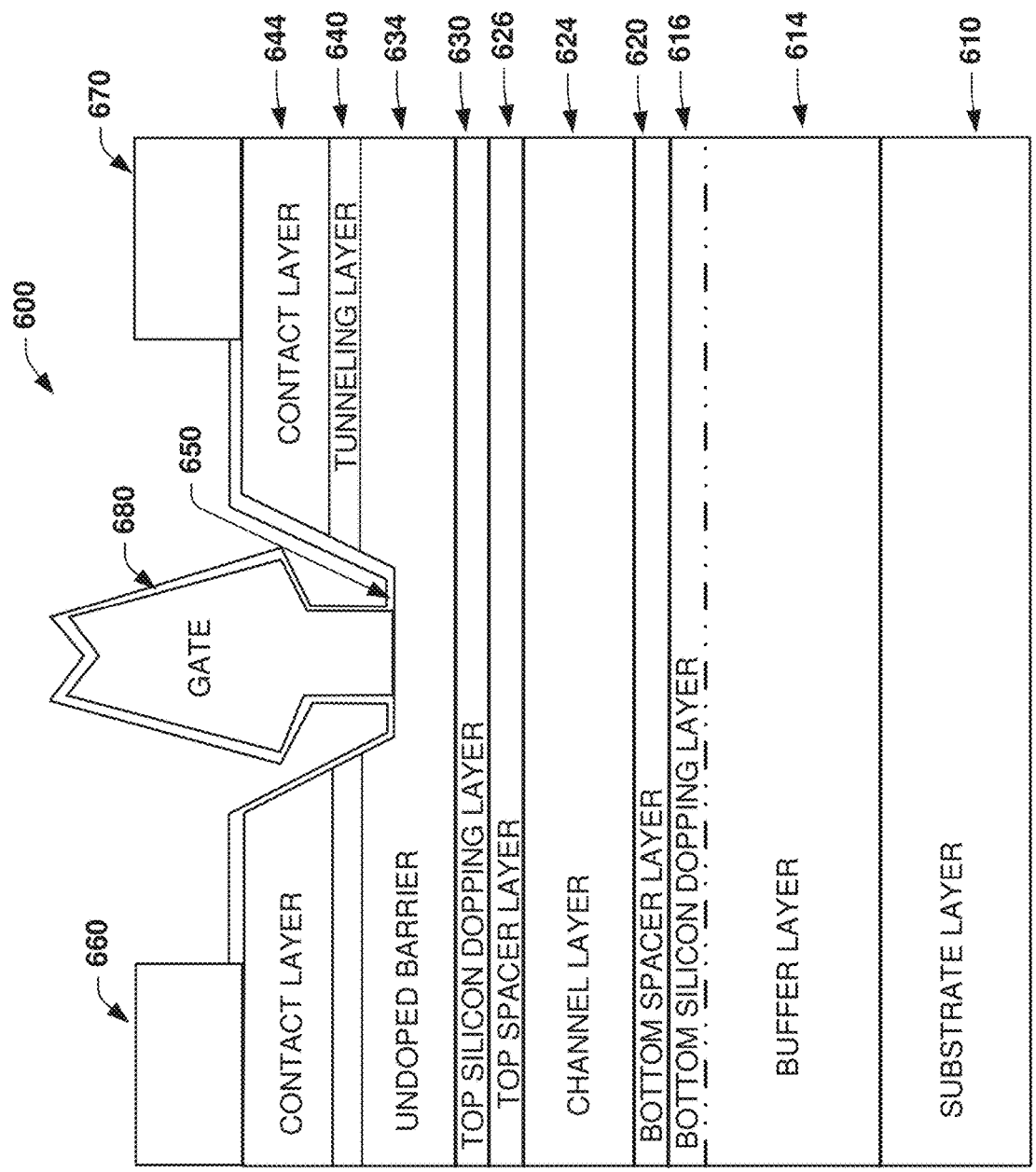
FIG. 6 illustrates yet another example of the semiconductor device transistor illustrated in FIG. 3.

FIG. 6 illustrates yet another example of the semiconductor device transistor illustrated in FIG. 3. A semiconductor device transistor 600 includes a substrate layer 610 and a buffer layer 614 disposed on the substrate layer. A bottom silicon doping layer 616 is disposed on the buffer layer 614, a bottom spacer layer 620 is disposed on the bottom silicon doping layer 616, a channel layer 624 is disposed on the bottom spacer layer 620, and a top spacer layer 626 is disposed on the channel layer 624. An undoped barrier layer 634 is disposed on the top silicon doping layer 630. A doped tunneling layer 640 is disposed on the undoped barrier layer 634 and a contact layer 644 is formed on the doped tunneling layer 640.

A gate region 650 is formed in the contact layer 644, the doped tunneling layer 640, and the barrier layer 634. An alloyed metal source contact 660 and an alloyed metal drain contact 670 are annealed on to the contact layer 644. A gate 680 is formed in the gate region 650 to control current from the alloyed metal drain contact 670 to the alloyed metal source contact 660. The alloyed metal contacts 660 and 670 can be composed of an alloy of metals as previously described with respect to FIG. 4. The barrier layer 634 is $In_{(0.50)}Ga_{(0.50)}$ P, with In being Indium, Ga being Gallium, and P being Phosphorus, doped the tunneling layer 640 is $Al_{(0.31)}Ga_{(0.69)}$ As, with Al being Aluminum, Ga being Gallium, and As being Arsenic (n+), and the contact layer 644 is n+GaAs. The substrate layer 610 is GaAs, the buffer layer 614 is $Al_{(0.25)}Ga_{(0.75)}$ As, and the channel layer 624 is $In_{(0.22)}Ga_{(0.78)}As$.

In view of the foregoing structural and functional features described above, an example method will be better appreciated with reference to FIGS. 7 through 13. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components configured in an integrated circuit, processor, or a controller, for example.

Figure 7:
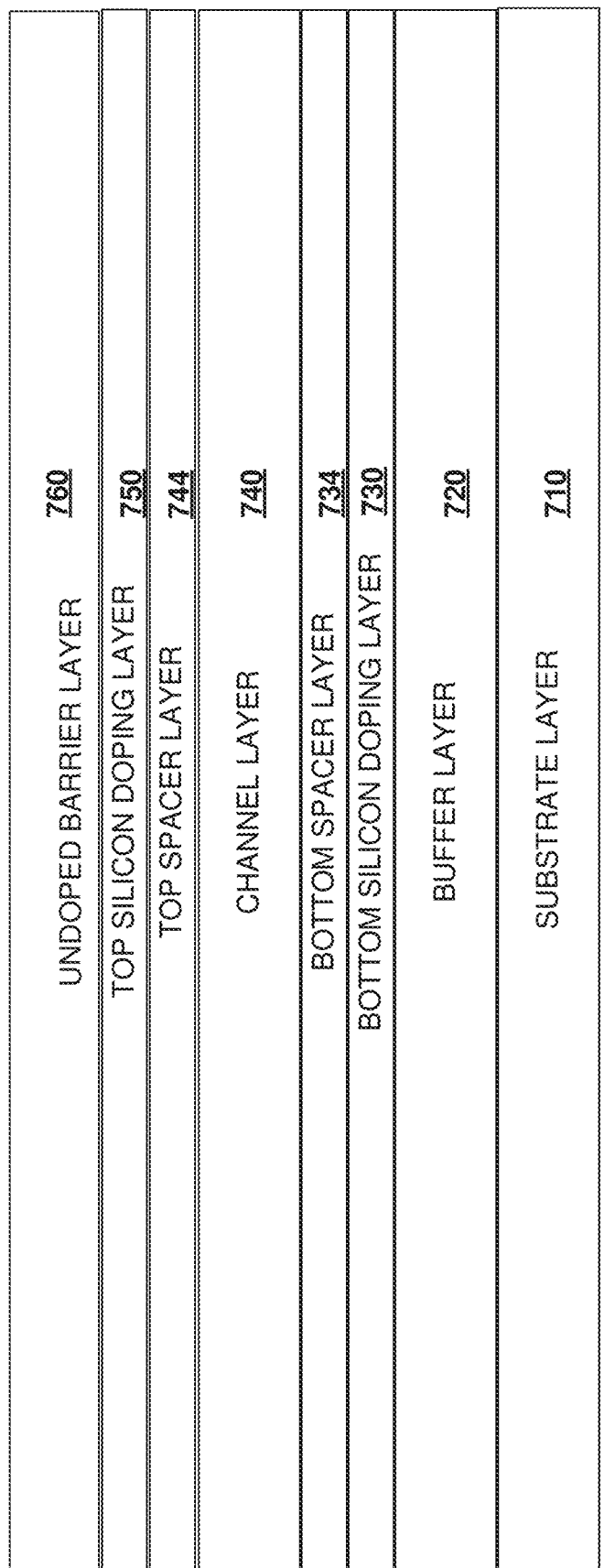
Figure 10:
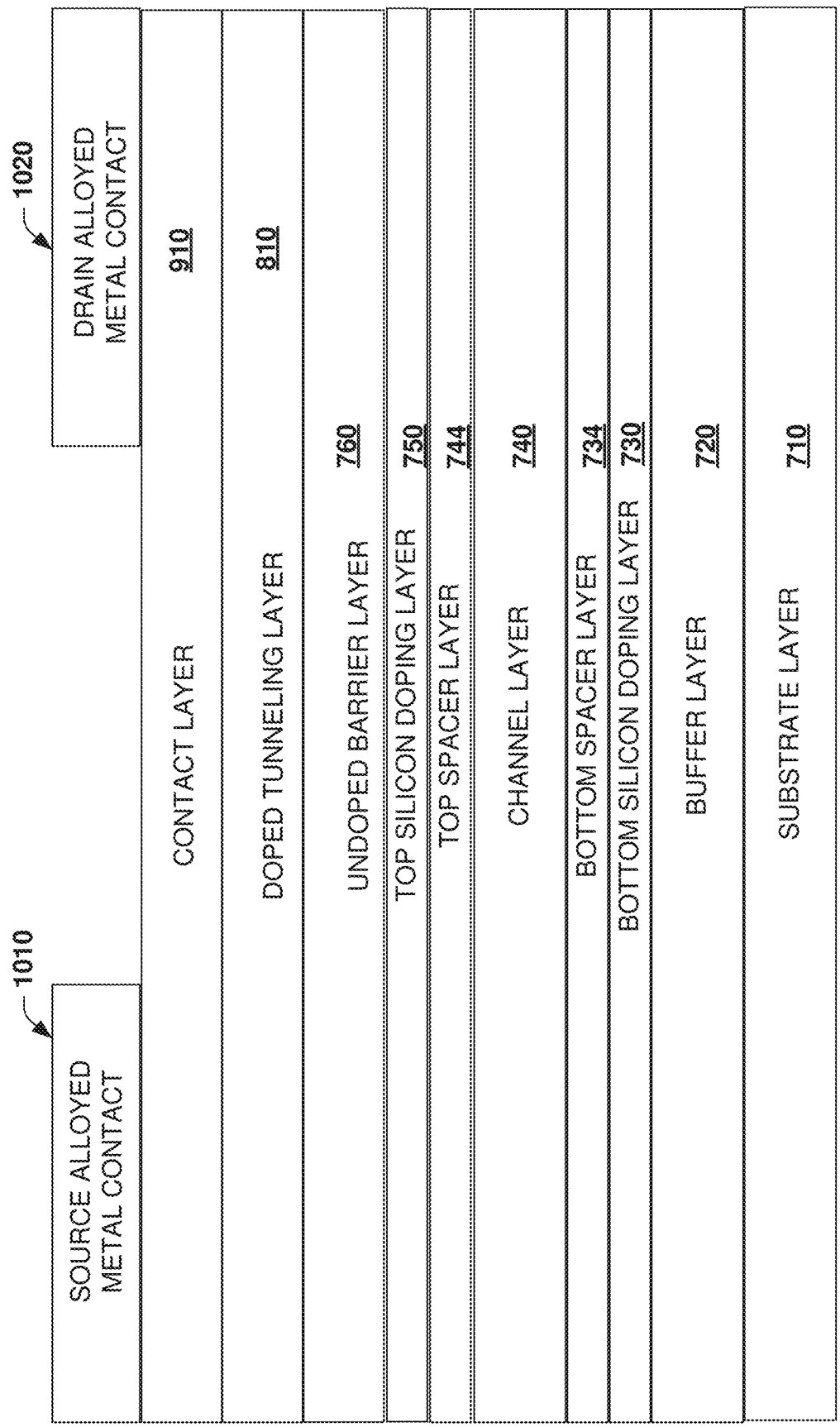
Figure 11:
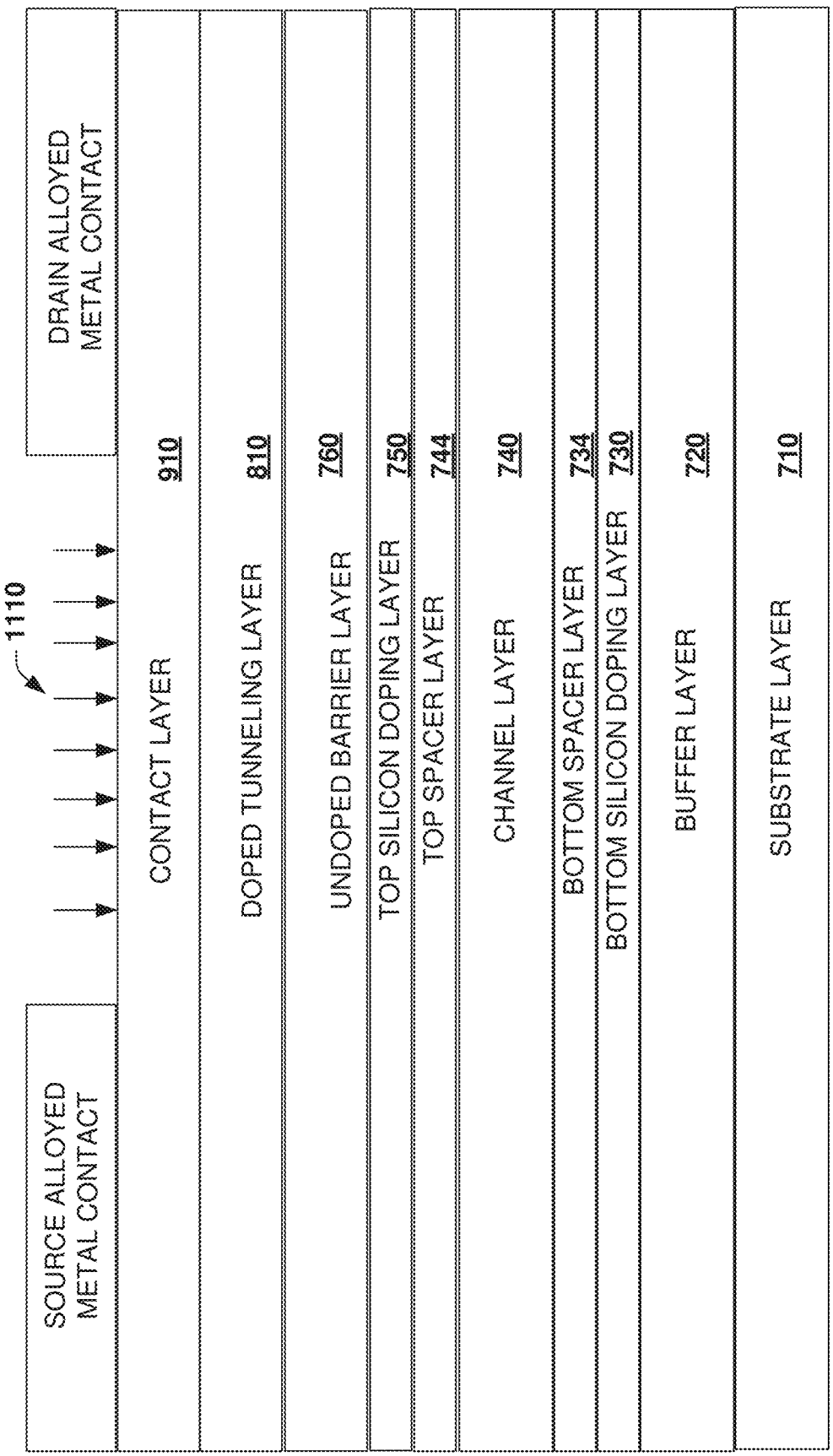
Figure 12:
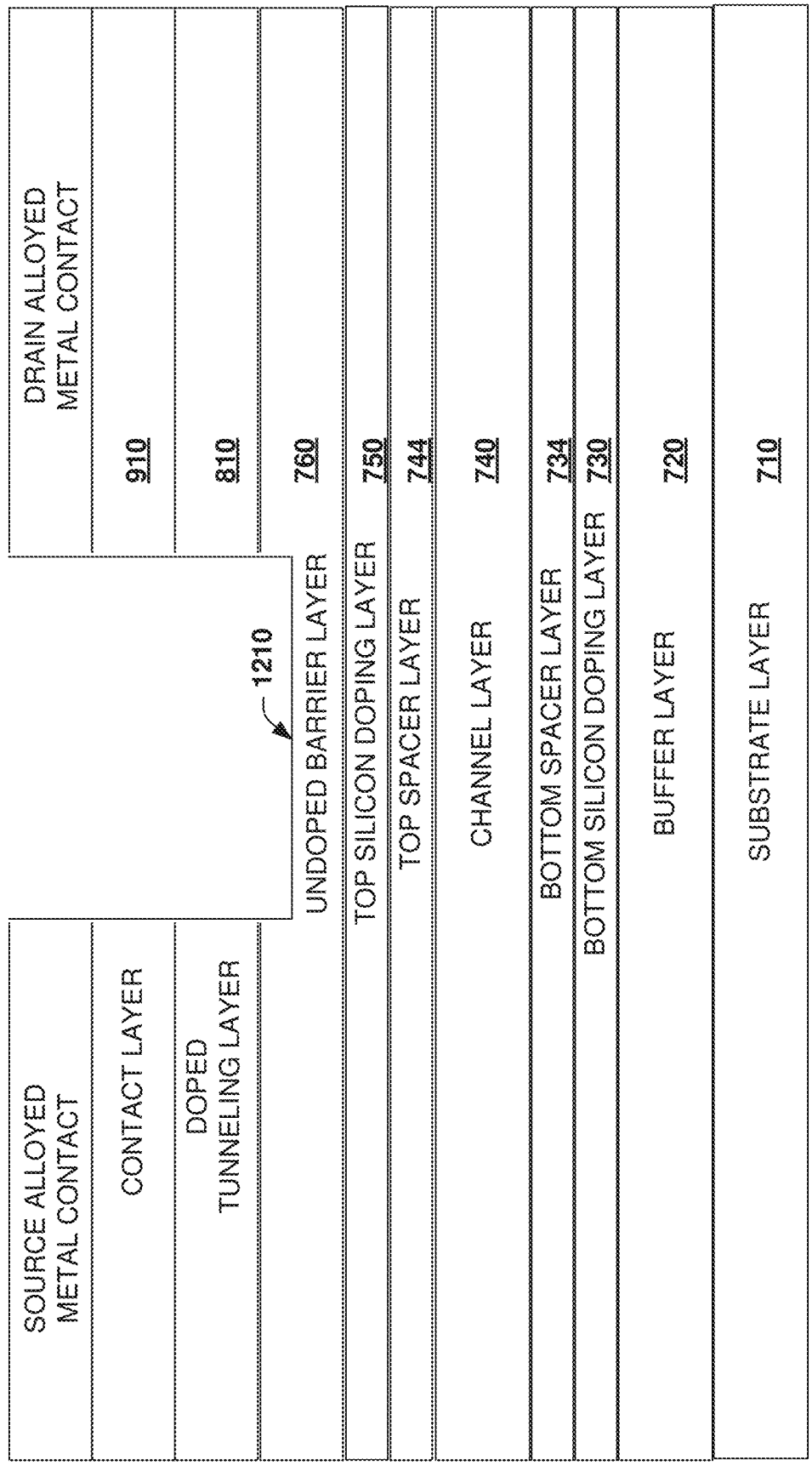
Figure 13:
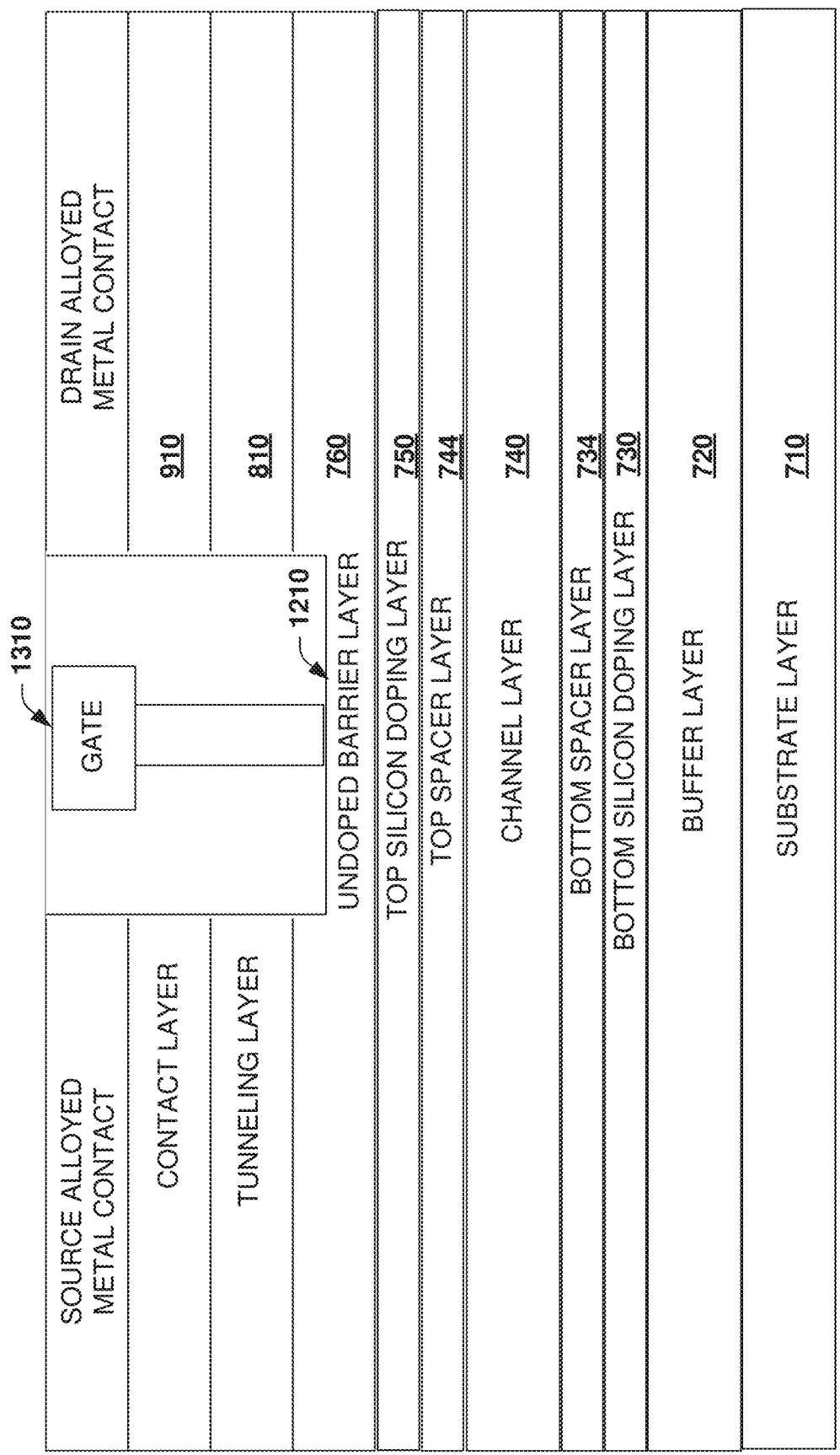

FIGS. 7-13 illustrate a method for forming the semiconductor devices illustrated in FIGS. 1-5. Referring to FIG. 7, several layers are formed which are referred to as base layers of FIGS. 1-3. At 710, the method includes forming a substrate layer and at 720 forming a buffer layer on the substrate layer. At 730, a bottom silicon doping layer is formed on the buffer layer where a bottom spacer layer 734 is formed on the bottom silicon doping layer 730. A channel layer is formed on the bottom spacer layer at 734. At 744, a top spacer layer is formed on the channel layer 740 and a top silicon doping layer 750 is formed on the channel layer 740. At 760, the method includes forming an undoped barrier layer on the top silicon doping layer at 750.

Referring to FIG. 8, the method includes forming a doped tunneling layer 810 on the undoped barrier layer 760. Referring to FIG. 9, the method includes forming a contact layer 910 on to the doped tunneling layer 810. At FIG. 10, a source alloyed metal contact 1010 and a drain alloyed metal contact 1020 are formed on the contact layer 910. At 1110, a removal process (e.g., masking and etching) is applied to the contact layer 910, doped tunneling layer 810, and undoped barrier layer 760 to form a gate region 1210 shown in FIG. 12. At FIG. 13, a gate 1310 (e.g., T-gate) can be formed in the gate region 1210. The gate 1310 can be formed by an evaporation process in which a metal such as titanium, platinum and gold or a combination thereof is heated to the point of vaporization and then evaporated to form the gate. The barrier layer 760 provides a Schottky barrier to the gate 1310.

Figure 14:
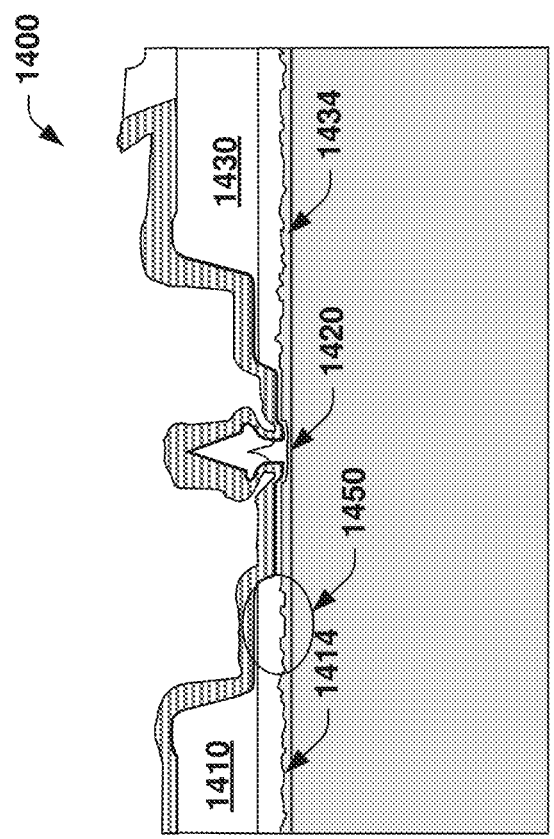
FIG. 14 illustrates an example cross-section of the semiconductor device transistor illustrated in FIG. 2.

FIG. 14 illustrates an example cross-section 1400 of the semiconductor device transistor illustrated in FIG. 2. In this example, a drain contact 1410 and metal stack 1414, a gate 1420, and source contact 1430 and metal stack 1434 are fabricated on base layers 1440. A region 1450 under the drain metal stack 1414 are magnified and illustrated in FIG. 15.

Figure 15:
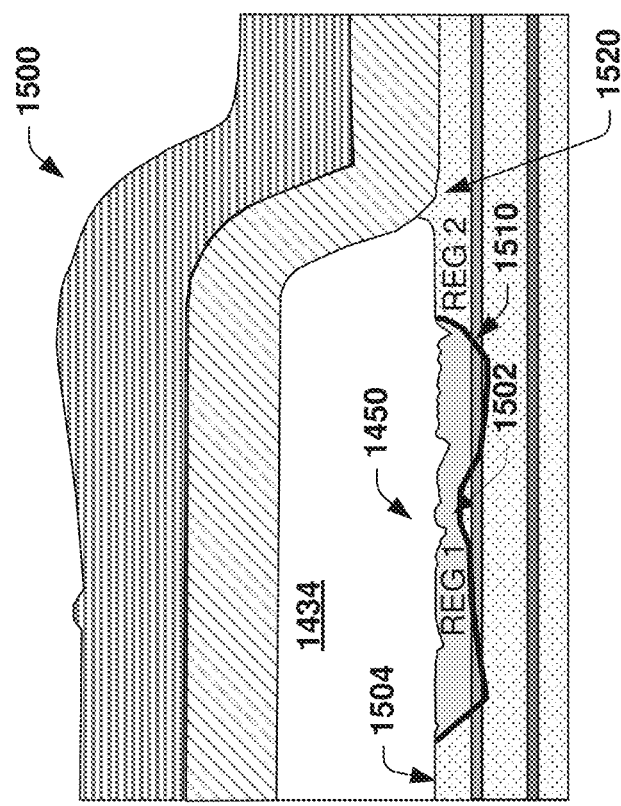
FIG. 15 illustrates an example cross-section of a portion of the semiconductor device transistor illustrated in FIG. 14.

FIG. 15 illustrates an example cross-section 1500 of a portion of the semiconductor device transistor illustrated in FIG. 14 is shown at 1450 of FIG. 15. As shown, a first region REG 1 shown at 1502 is formed when the drain metal stack 1434 diffuses into a contact layer 1504 and into a tunneling layer at 1510. An area REG 2 where substantially no diffusion of the metal stack 1434 occurs is shown at 1520. The tunneling layer 1510 facilitates electron mobility of REG 2 at 1520 and improves the overall performance of the semiconductor transistor device as described herein.

Figure 16:
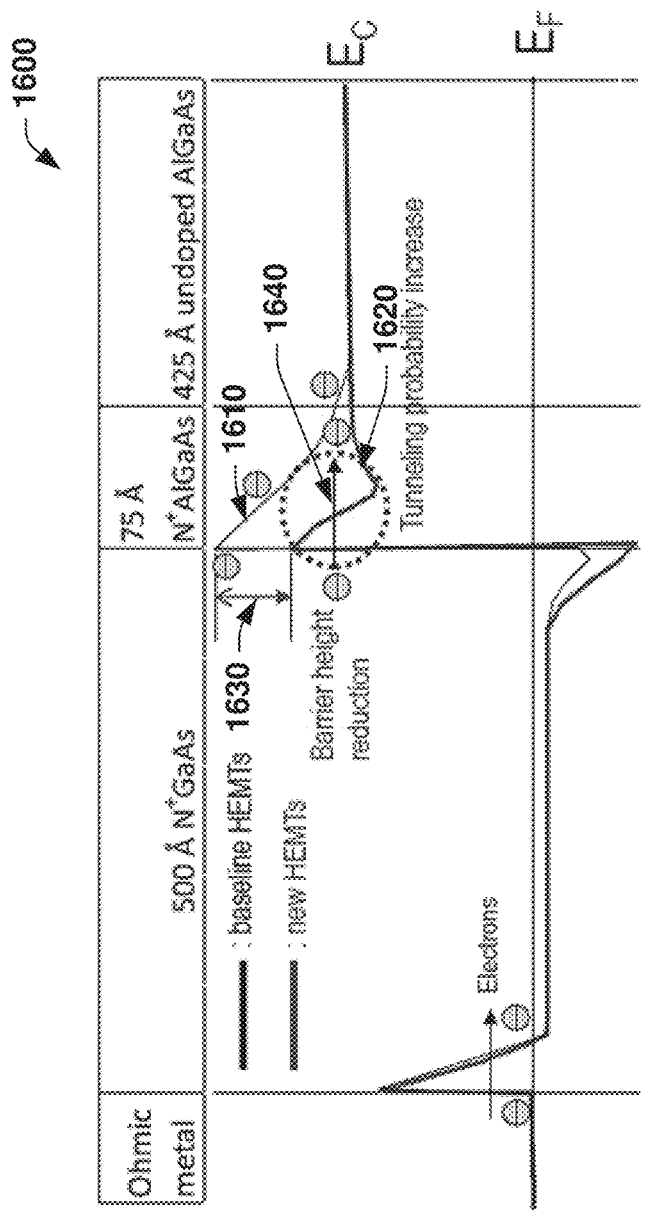
FIG. 16 illustrates an example diagram showing barrier height and tunneling probability improvements over baseline semiconductors that do not employ localized tunneling as described herein.

FIG. 16 illustrates an example diagram 1600 showing barrier height and tunneling probability improvements over baseline semiconductors that do not employ localized tunneling as described herein. Here, a baseline transistor line is shown at 1610 and a localized tunneling transistor as described herein is shown at 1620. Electron flow is shown on the horizontal axis on the diagram 1600 and energy required to produce the electron flow is shown on the vertical axis. As shown, by providing the tunneling layer under region 2 as described herein. A barrier height reduction is shown at 1630 and a tunneling probability increase is shown at 1640 which demonstrate improved transistor performance over transistors that do not employ a tunneling layer (or layers) underneath region 2.

Figure 17:
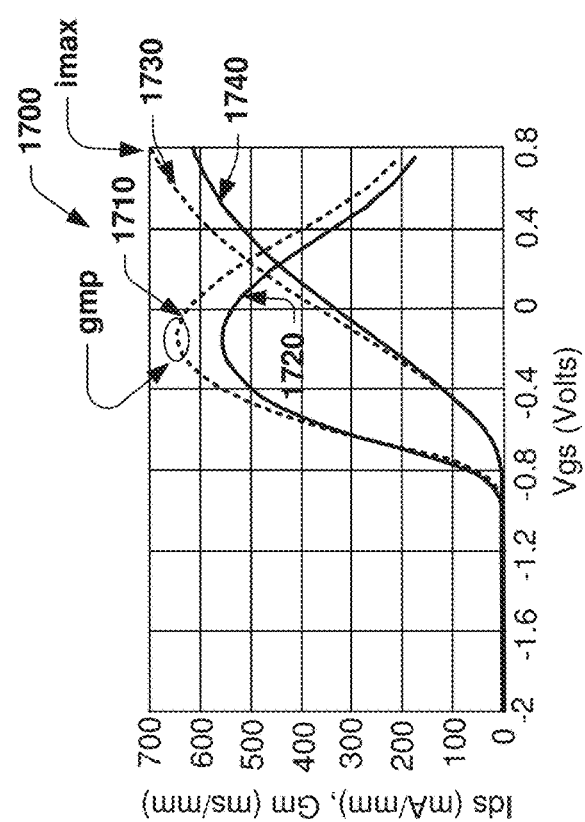
FIG. 17 illustrates an example diagram showing transconductance versus VGS performance between localized tunneling devices and non-localized tunneling devices.

FIG. 17 illustrates an example diagram 1700 showing transconductance versus VGS performance between localized tunneling devices and non-localized tunneling devices. Voltage-Gate-to-Source (VGS) is represented on the horizontal axis. A drain current curve 1730 from a localized tunneling device (current drain-to-source—IDS) is shown as increased over a drain current curve at 1740 from a non-localized device, where these curves are represented as milliamperes/millimeter on the vertical axis. A gain (Gm) curve 1710 from a localized tunneling device is shown as increased over a curve at 1720 from a non-localized tunneling device, where these curves are represented as milliSeimens/millimeter on the vertical axis.

Figure 18:
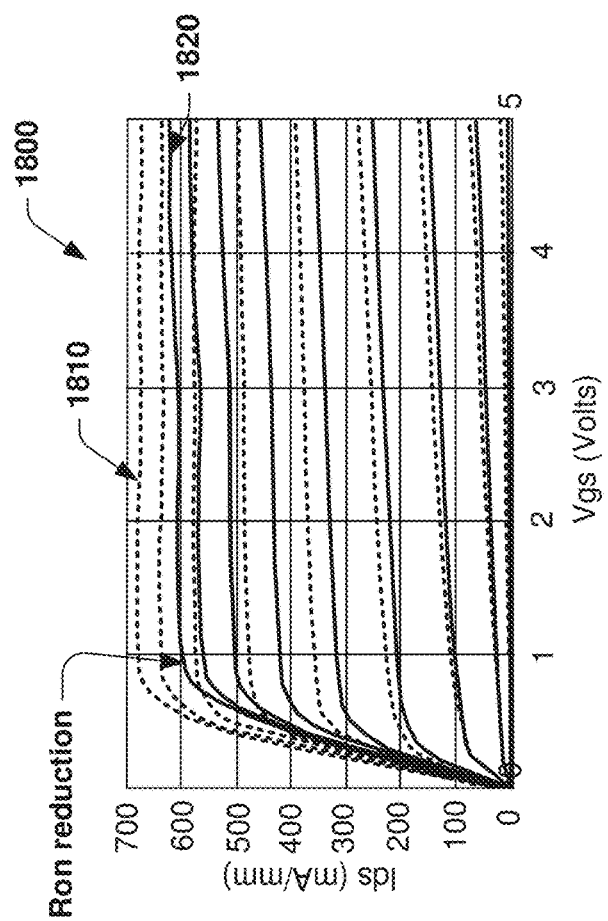
FIG. 18 illustrates an example diagram showing drain current versus VDS performance between localized tunneling devices and non-localized tunneling devices.

FIG. 18 illustrates an example diagram 1800 showing drain current (IDS) versus voltage drain-to-source (VDS) performance between localized tunneling devices and non-localized tunneling devices. Current IDS is shown on the vertical axis in mA/mm, and VGS is represented on horizontal axis in volts. As shown at a given voltage at 1810 for a localized tunneling device, more current flows than a non-localized tunneling device shown at 1820. This higher current flow at a given VDS voltage indicates a lower on resistance (RON) for the localized tunneling devices.

Figure 19:
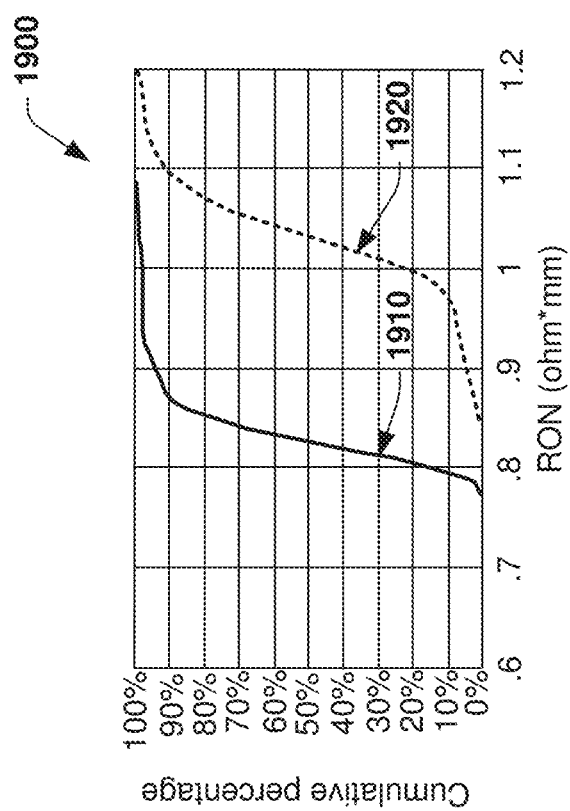
FIG. 19 illustrates an example diagram showing percentage increase in on-resistance performance between localized tunneling devices and non-localized tunneling devices.

FIG. 19 illustrates an example diagram 1900 showing percentage increase in on-resistance performance between localized tunneling devices and non-localized tunneling devices. Cumulative percentage is represented on the vertical axis for a localized tunneling device 1910 and a non-localized device 1920, where resistance RON is shown as ohms*mm on the horizontal axis. As shown, approximately 20% lowering in RON is shown at 1910 versus RON of the non-localized tunneling device of 1920.

Figure 20:
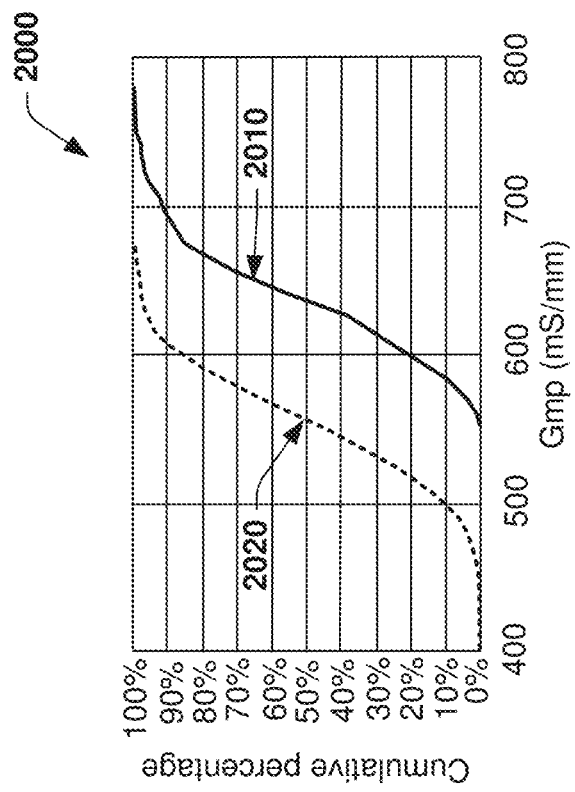
FIG. 20 illustrates an example diagram showing percentage increase in gain performance between localized tunneling devices and non-localized tunneling devices.

FIG. 20 illustrates an example diagram 2000 showing percentage increase in gain performance between localized tunneling devices and non-localized tunneling devices. Cumulative percentage is represented on the vertical axis for a localized tunneling device 2010 and a non-localized device 2020, where gain GMP is shown as mSiemens/mm on the horizontal axis. As shown, approximately 13.3% improvement in GMP is shown at 2010 versus GMP of the non-localized tunneling device of 2020.

Figure 21:
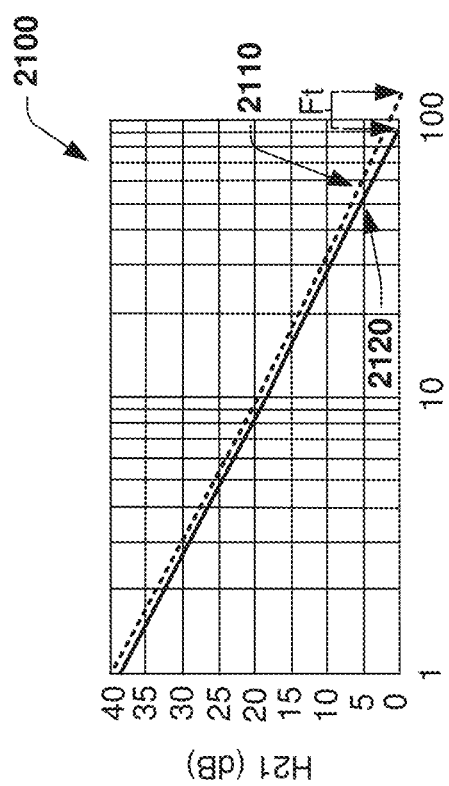
FIG. 21 illustrates an example diagram showing cut-off frequency performance between localized tunneling devices and non-localized tunneling devices.

FIG. 21 illustrates an example diagram 2100 showing cut-off frequency performance between localized tunneling devices and non-localized tunneling devices. Frequency in Giga Hertz is represented on the horizontal axis and H21 gain in decibels (dB) is shown on the vertical axis. As shown at 2110, the localized tunneling device has a higher gain at a given frequency than a non-localized device at 2120.

Figure 22:
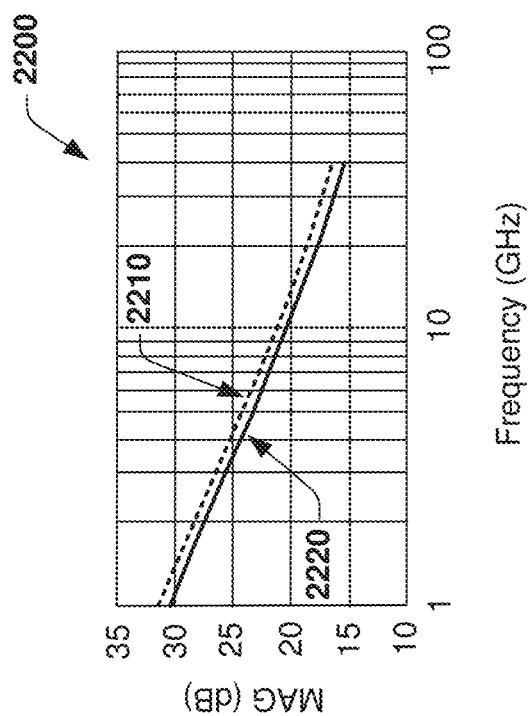
FIG. 22 illustrates an example diagram showing gain performance between localized tunneling devices and non-localized tunneling devices.

FIG. 22 illustrates an example diagram 2200 showing gain performance between localized tunneling devices and non-localized tunneling devices. Frequency in Giga Hertz (GHz) is represented on the horizontal axis and RF gain in decibel (dB) magnitude is shown on the vertical axis maximum available gain (MAG)). As shown at 2210, the localized tunneling device has a higher MAG gain at a given frequency than a non-localized device at 2220.

Figures 23, 24:
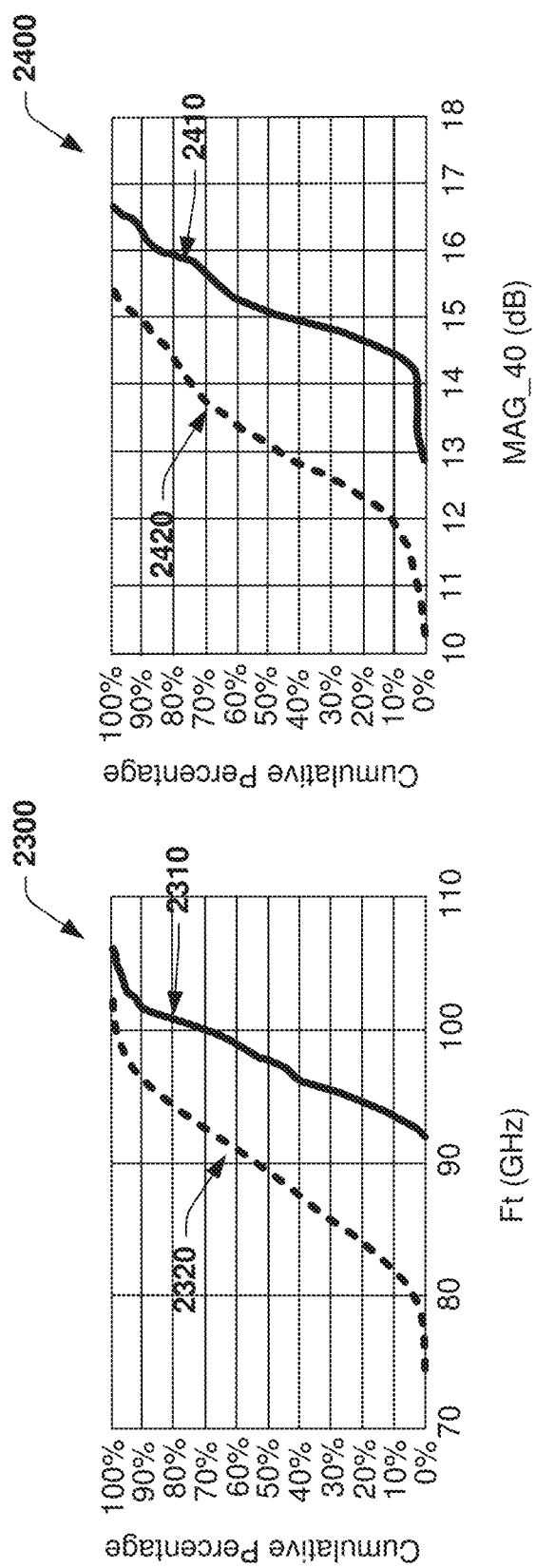
FIG. 23 illustrates an example diagram showing percentage increase in cut-off frequency performance between localized tunneling devices and non-localized tunneling devices.
FIG. 24 illustrates an example diagram showing percentage increase in gain performance between localized tunneling devices and non-localized tunneling devices.

FIG. 23 illustrates an example diagram 2300 showing percentage increase in cut-off frequency performance between localized tunneling devices and non-localized tunneling devices. The horizontal axis represents cut-off frequency in GHz and the vertical axis represents cumulative percentage. As shown, the localized tunneling device at 2310 has approximately 9 Ghz in improvement over a non-localized tunneling device at 2320.

FIG. 24 illustrates an example diagram 2400 showing percentage increase in maximum available gain (MAG) performance at 40 GHz between localized tunneling devices and non-localized tunneling devices. The horizontal axis represents gain magnitude in dB and the vertical axis represents cumulative percentage. As shown, the localized tunneling device at 2410 has approximately 2 dB in improvement over a non-localized tunneling device at 2420.

What has been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A semiconductor device, comprising:
a plurality of base layers;
a tunneling layer disposed on the plurality of base layers;
a contact layer disposed on the tunneling layer;
an alloyed metal contact annealed on to the contact layer, the alloyed metal contact forms a first region and a second region in the contact layer, the first region of the contact layer diffuses into the tunneling layer, the second region of the contact layer resides over the tunneling layer, wherein the tunneling layer facilitates electron mobility of the second region.

2. The semiconductor device of claim 1, wherein the alloyed metal contact is a drain or a source of the semiconductor device.

3. The semiconductor device of claim 1, wherein the alloyed metal contact is formed from at least two of gold (Au), Nickle (Ni), and Germanium (Ge).

4. The semiconductor device of claim 1, wherein the plurality of base layers includes a barrier layer, the tunneling layer disposed on the barrier layer, wherein the barrier layer is about 425 angstroms in thickness and the tunneling layer is about 75 angstroms in thickness.

5. The semiconductor device of claim 4, wherein the barrier layer is undoped $Al_{(0.25)}Ga_{(0.75)}$ As, with Al being Aluminum, Ga being Gallium, and As being Arsenic, the tunneling layer is $Al_{(0.25)}Ga_{(0.75)}$ As that is doped with silicon (n+), and the contact layer is n+GaAs.

6. The semiconductor device of claim 4, wherein the barrier layer is undoped $In_{(0.50)}Ga_{(0.50)}$ P, with In being Indium, Ga being Gallium, and P being Phosphorus, the tunneling layer is $In_{(0.50)}Ga_{(0.50)}$ P that is doped with silicon (n+), and the contact layer is n+GaAs.

7. The semiconductor device of claim 4, wherein the barrier layer is undoped $In_{(0.50)}Ga_{(0.50)}$ P, with In being Indium, Ga being Gallium, and P being Phosphorus, the tunneling layer is $Al_{(0.31)}Ga_{(0.69)}$ As that is doped with silicon (n+), and the contact layer is n+GaAs.

8. The semiconductor device of claim 4, the plurality of base layers further comprising a channel layer having a top and bottom spacer layer, the top spacer layer having a top silicon doping layer and the bottom spacer layer having a bottom silicon doping layer, the barrier layer disposed on the top silicon doping layer, the channel layer including $In_{(0.22)}Ga_{(0.78)}$As with In being Indium, Ga being Gallium and As being Arsenic.

9. The semiconductor device of claim 8, the plurality of base layers further comprising a buffer layer disposed on a substrate layer, the bottom silicon doping layer disposed on the buffer layer, the buffer layer includes $Al_{(0.25)}Ga_{(0.75)}$ As, with Al being Aluminum, Ga being Gallium, and As being Arsenic.

10. The semiconductor device of claim 1, wherein a gate region is formed in the plurality of base layers, the tunneling layer and the contact layer, the gate region includes a gate formed thereon to control the semiconductor device.

11. A method of forming a semiconductor device, comprising:
forming a plurality of base layers on a substrate;
forming a tunneling layer on the plurality of base layers;

forming a contact layer on the tunneling layer;

annealing an alloyed drain or alloyed source contact on to the contact layer that forms a first region and a second region in the contact layer, the first region of the contact layer diffuses into the tunneling layer, the second region of the contact layer is diffused less than the first region into the tunneling layer, wherein the tunneling layer facilitates electron transport within the second region.

12. The method of claim 11, further comprising forming the alloyed metal contact from at least two of gold (Au), Nickle (Ni), and Germanium (Ge).

13. The method of claim 11, wherein forming the plurality of base layers includes forming a barrier layer, the tunneling layer formed on the barrier layer, wherein the barrier layer is about 425 angstroms in thickness and the tunneling layer is about 75 angstroms in thickness.

14. The method of claim 13, wherein the barrier layer is formed of undoped $Al_{(0.25)}Ga_{(0.75)}$ As, with Al being Aluminum, Ga being Gallium, and As being Arsenic, the tunneling layer is formed of $Al_{(0.25)}Ga_{(0.75)}As$ that is doped with silicon (n+), and the contact layer is formed of n+GaAs.

15. The semiconductor device of claim 13, wherein the barrier layer is formed of undoped $In_{(0.50)}Ga_{(0.50)}P$, with In being Indium, Ga being Gallium, and P being Phosphorus, the tunneling layer is formed of $In_{(0.50)}Ga_{(0.50)}P$ that is doped with silicon (n+), and the contact layer is formed of n+GaAs.

16. The method of claim 13, wherein the barrier layer is formed of undoped $In_{(0.50)}Ga_{(0.50)}$ P, with In being Indium, Ga being Gallium, and P being Phosphorus, the tunneling layer is formed of $Al_{(0.31)}Ga_{(0.69)}As$ that is doped with silicon (n+), and the contact layer is formed of n+GaAs.

17. The method of claim 16, further comprising forming a channel layer having a top and bottom spacer layer, the top spacer layer having a top silicon doping layer and the bottom spacer layer having a bottom silicon doping layer, and forming the barrier layer on the top silicon doping layer, the channel layer formed of $In_{(0.22)}Ga_{(0.78)}As$ with In being Indium, Ga being Gallium, and As being Arsenic.

18. The method of claim 17, further comprising forming a buffer layer on the substrate layer, the bottom silicon doping layer formed on the buffer layer, the buffer layer includes $Al_{(0.25)}Ga_{(0.75)}$ As, with Al being Aluminum, Ga being Gallium, and As being Arsenic.

19. An integrated circuit, comprising:
a substrate layer;
a buffer layer disposed on the substrate layer;
a bottom silicon doping layer disposed on the buffer layer;
a bottom spacer layer disposed on the bottom silicon doping layer;
a channel layer disposed on the bottom spacer layer;
a top spacer layer disposed on the channel layer;
a top silicon doping layer disposed on the top spacer layer;
an undoped barrier layer disposed on the top silicon doping layer;
a doped tunneling layer disposed on the undoped barrier layer;
a contact layer formed on the doped tunneling layer;
a gate region formed in the contact layer, the doped tunneling layer, and undoped the barrier layer;
an alloyed metal source contact and an alloyed metal drain contact annealed on to the contact layer, the alloyed metal source contact forms a first source region and a second source region in the contact layer and the alloyed metal drain contact forms a first drain region and a second drain region in the contact layer, the first source region and the first drain region of the contact layer diffuses into the doped tunneling layer, the second source region and the second drain region of the contact layer resides over the doped tunneling layer, wherein the doped tunneling layer facilitates electron mobility of the second source region and the second drain region; and
a gate formed in the gate region to control current from the alloyed metal drain contact to the alloyed metal source contact.

20. The integrated circuit of claim 19, wherein the barrier layer is about 425 angstroms in thickness and the tunneling layer is about 75 angstroms in thickness, wherein the barrier layer is $Al_{(0.25)}Ga_{(0.75)}$ As, with Al being Aluminum, Ga being Gallium, and As being Arsenic, the doped tunneling layer is $Al_{(0.25)}Ga_{(0.75)}$ As that is doped with silicon (n+), and the contact layer is n+GaAs.

* * * * *